(12) United States Patent
Kim et al.

(10) Patent No.: US 7,589,462 B2
(45) Date of Patent: Sep. 15, 2009

(54) ORGANIC ELECTRO-LUMINESCENCE DISPLAY DEVICE AND FABRICATING METHOD THEREOF

(75) Inventors: Kwang Young Kim, Seoul (KR); Hak Su Kim, Seoul (KR); Kwang Heum Baik, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/150,249

(22) Filed: Jun. 13, 2005

(65) Prior Publication Data
US 2005/0275345 A1 Dec. 15, 2005

(30) Foreign Application Priority Data
Jun. 14, 2004 (KR) .................. 10-2004-0043716

(51) Int. Cl.
*H01J 63/04* (2006.01)
(52) U.S. Cl. .................. 313/504; 313/498; 313/512
(58) Field of Classification Search ............. 313/504, 313/512
See application file for complete search history.

(56) References Cited

U.S. PATENT DOCUMENTS

| | | | |
|---|---|---|---|
| 6,037,005 A * | 3/2000 | Moshrefzadeh et al. | 427/286 |
| 6,320,311 B2 * | 11/2001 | Nakaya et al. | 313/506 |
| 6,995,508 B2 * | 2/2006 | Peng | 313/504 |
| 2001/0024083 A1 * | 9/2001 | Yamazaki et al. | 313/483 |
| 2003/0096197 A1 | 5/2003 | Lee et al. | |
| 2003/0218421 A1 * | 11/2003 | Peng | 313/506 |
| 2004/0063041 A1 | 4/2004 | Lu | |
| 2004/0079941 A1 * | 4/2004 | Yamazaki et al. | 257/40 |
| 2005/0116629 A1 | 6/2005 | Takamura et al. | |
| 2005/0264728 A1 * | 12/2005 | Funahata et al. | 349/114 |

FOREIGN PATENT DOCUMENTS

| | | |
|---|---|---|
| JP | 10308286 | 11/1998 |
| WO | WO-03075616 | 9/2003 |

* cited by examiner

*Primary Examiner*—Toan Ton
*Assistant Examiner*—Hana A Sanei
(74) *Attorney, Agent, or Firm*—Birch, Stewart, Kolasch & Birch, LLP

(57) ABSTRACT

An organic EL display device that is adaptive for improving luminous brightness and reducing power consumption, and a fabricating method thereof are disclosed.

An organic EL display device according to the present invention includes a plurality of anode electrodes; and a conductive light shielding film which has conductivity and is formed on the anode electrode in a separate pattern so that the anode electrodes are insulated from one another.

13 Claims, 10 Drawing Sheets

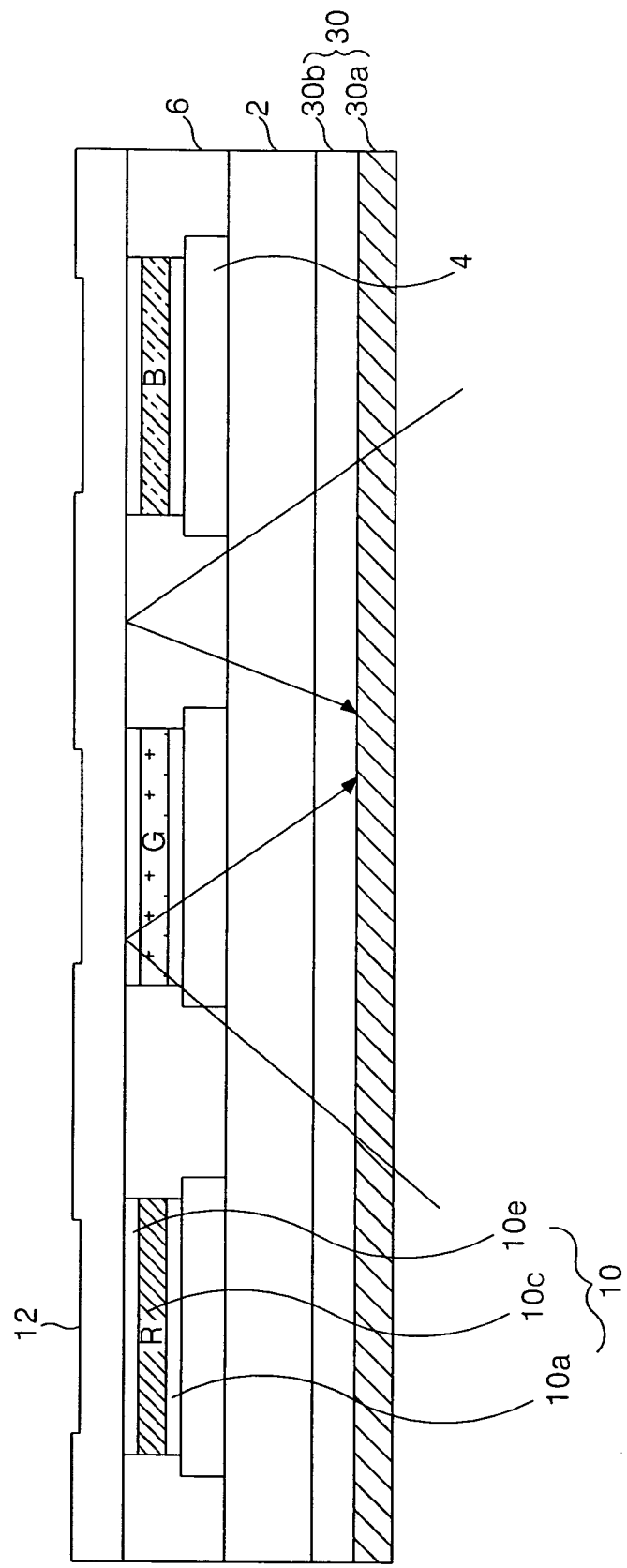

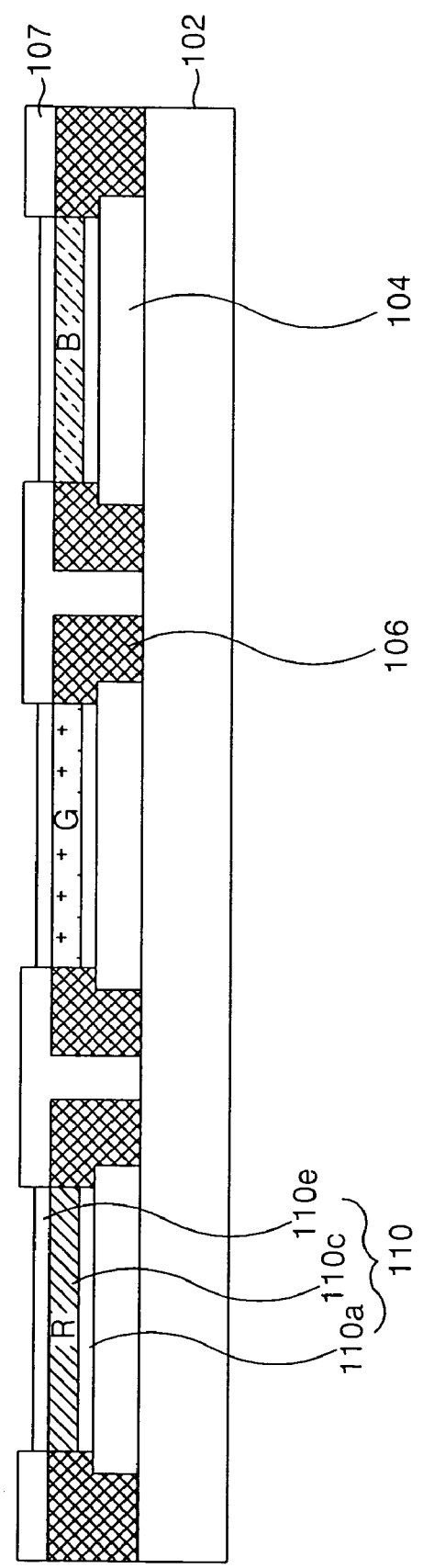

ORGANIC ELECTRO-LUMINESCENCE DISPLAY DEVICE AND FABRICATING METHOD THEREOF

This application claims the benefit of Korean Patent Application No. P2004-43716 filed in Korea on Jun. 14, 2004, which is hereby incorporated by reference

BACKGROUND OF THE INVENTION

1. Field of the Invention

This invention relates to an organic electro luminescence display device, and more particularly to an organic electro luminescence display device that is adaptive for improving luminous brightness and reducing power consumption, and a fabricating method thereof.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device. Particularly, the EL display device has electrodes stuck to both of the sides of an organic light emitting layer basically composed of a hole transport layer, a light emitting layer and an electron transport layer, and becomes the center of attention as a next generation flat panel display device because of its characteristics such as wide viewing angle, high aperture ratio and high chromaticity.

The EL display device is largely divided into an inorganic EL display device and an organic EL display device in accordance with a material used. In the organic EL display device, electrons and holes form a pair and then become extinct to emit light if electric charges are injected into an organic EL layer which is formed between a hole injection electrode and an electron injection electrode, thus there is an advantage in that it can be driven at a lower voltage than the inorganic EL display device. Further, the organic EL display device can drive at a low voltage of not greater than 10V in comparison with the PDP or the inorganic ELD as well as forming the device on a flexible transparent substrate like plastics, and its power consumption is relative low and its color impression is excellent.

FIG. 1 is a perspective view representing a related art organic EL display device, and FIG. 2 is a sectional diagram representing the organic EL display device shown in FIG. 1, taken along the line "I-I'".

The organic EL display device shown in FIGS. 1 and 2 has an anode electrode 4 and a cathode electrode formed in a direction of crossing each other on a substrate 2.

A plurality of anode electrodes 4 is formed to be separate from one another with a designated distance therebetween. An insulating film 6 having a hollow part for each EL cell (p) area is formed on the substrate 2 where the anode electrode 4 is formed. A barrier rib 8 is located on the insulating film 6, wherein the barrier rib separates an organic light emitting layer 10 and the cathode electrode 12 which are to be formed on the insulating film 6. The barrier rib 8 is formed in a direction of traversing the anode electrode 4 and has a reverse taper structure that an upper part has a wider width than a lower part. The organic light emitting layer 10 and the cathode electrode 12 composed of an organic compound are sequentially deposited on the whole surface of the insulating film where the barrier rib 8 is formed. The organic light emitting layer 10 is formed by depositing a hole related layer 10A inclusive of a hole injection layer and a hole transport layer; a light emitting layer 10C to realize color; and an electron related layer 10E inclusive of an electron transport layer and an electron injection layer.

In the organic EL display device, if a voltage is applied to the anode electrode 4 and the cathode electrode 12, the electron generated at the cathode electrode 12 moves to the light emitting layer 10C through the electron related layer 10E. Further, the holes generated at the anode electrode 4 moves to the light emitting layer 10C through the hole related layer 10A. Accordingly, in the light emitting layer 10C, the electron and the hole supplied from the electron related layer 10E and the hole related layer 10A are recombined to form an exiton, and the exiton is excited again to a ground state, thus a light of a fixed energy is emitted to the outside through the anode electrode 4.

The organic EL display device with such a configuration has the incident light from the outside almost completely transmitted through the anode electrode 4 and the organic light emitting layer 10. As a result, when the light is not emitted from the organic light emitting layer 10, an external light 40 which is incident from the surface of the substrate 2 is transmitted through the organic light emitting layer 10 and the anode electrode 4 of a transparent conductive material, and it is reflected by the cathode electrode 12 of a metal electrode, as shown in FIG. 3A. Accordingly, there is a problem in that the contrast ratio is deteriorated. In order to solve the problem, as shown in FIG. 3B, a reflection protective film 30 is used. The reflection protective film 30 is stuck to the substrate 2 of the organic EL display device to intercept the external light 40 from being emitted out of the organic EL display device by being reflected after the external light 40 is irradiated from the outside. Herein, the reflection protective film 30 includes a polarizer 30A which transmits a specific linear polarized light out of the external light 40 and intercepts the other polarization component, and a λ/4 phase difference plate 30B for converting the linear polarized light into a circular polarized light.

However, the contrast ratio can be improved if such a polarizer 30A is used, but the transmittance cannot be over 50% due to the optical characteristics of the polarizer 30A in case that a polarization ratio is not less than 99%, thus a brightness loss of not less than 50% is generated in the organic EL display panel. Accordingly, there arises a problem that the power consumption should be increased to get a desired brightness in the organic EL display device.

SUMMARY OF THE INVENTION

Accordingly, it is an object of the present invention to an organic electro luminescence display device that is adaptive for improving luminous brightness and reducing power consumption, and a fabricating method thereof.

In order to achieve these and other objects of the invention, an organic electro luminescence display device according to an aspect of the present invention includes a plurality of anode electrodes; and a conductive light shielding film which has conductivity and is formed on the anode electrode in a separate pattern so that the anode electrodes are insulated from one another.

The conductive light shielding film partially exposes the anode electrode to define a light emitting area.

The organic electro luminescence display device further includes an organic light emitting layer formed on the anode electrode; a barrier rib formed to cross the anode electrode; and a cathode electrode formed to cross the anode electrode with the organic light emitting layer therebetween.

The conductive light shielding film includes an opaque material.

The resistivity of the conductive light shielding film is about 20~200 [μΩ·cm].

A fabricating method of an organic electro luminescence display device according to another aspect of the present invention includes the steps of forming a plurality of anode electrodes on a substrate; and forming a conductive light shielding film on the anode electrodes in a separate pattern, wherein the conductive light shielding film has conductivity and makes the anode electrodes insulated from one another.

The conductive light shielding film partially exposes the anode electrode to define a light emitting area.

The fabricating method further includes the steps of forming an organic light emitting layer on the anode electrode; forming a barrier rib to cross the anode electrode; and forming a cathode electrode to cross the anode electrode with the organic light emitting layer therebetween.

The conductive light shielding film includes an opaque material.

BRIEF DESCRIPTION OF THE DRAWINGS

These and other objects of the invention will be apparent from the following detailed description of the embodiments of the present invention with reference to the accompanying drawings, in which:

FIG. 3B is a diagram for explaining a reflection protective film which is to prevent the reflection by the external light;

FIGS. 6A to 6D are diagrams representing a fabricating method of the organic EL display device shown in FIG. 4, step by step.

DETAILED DESCRIPTION OF THE PREFERRED EMBODIMENT

There will be described in detail an organic electro luminescence display device according to the present invention in reference to the accompanying drawings.

Hereinafter, the preferred embodiments of the present invention will be described in detail with reference to FIGS. 4 to 6D.

Figure 1:
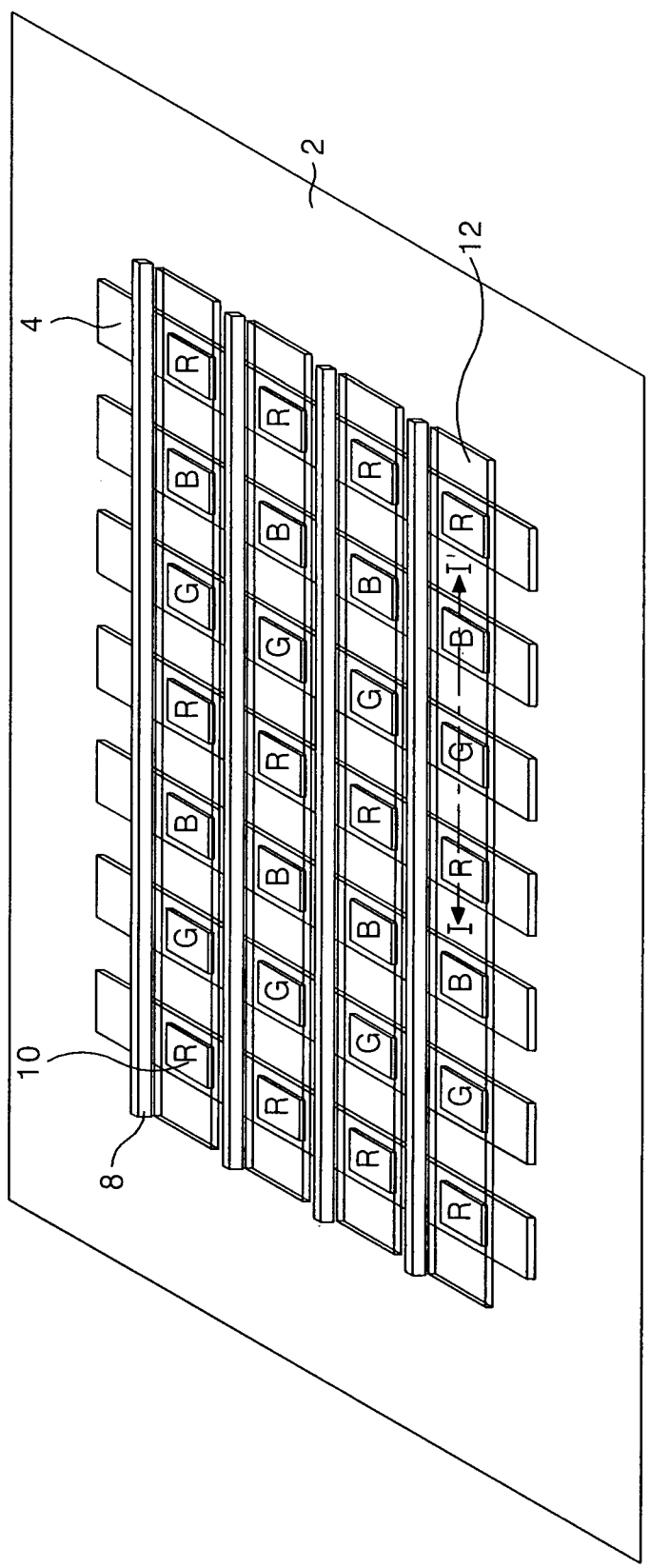
FIG. 1 is a diagram briefly representing a related art organic EL display device.
Figure 2:
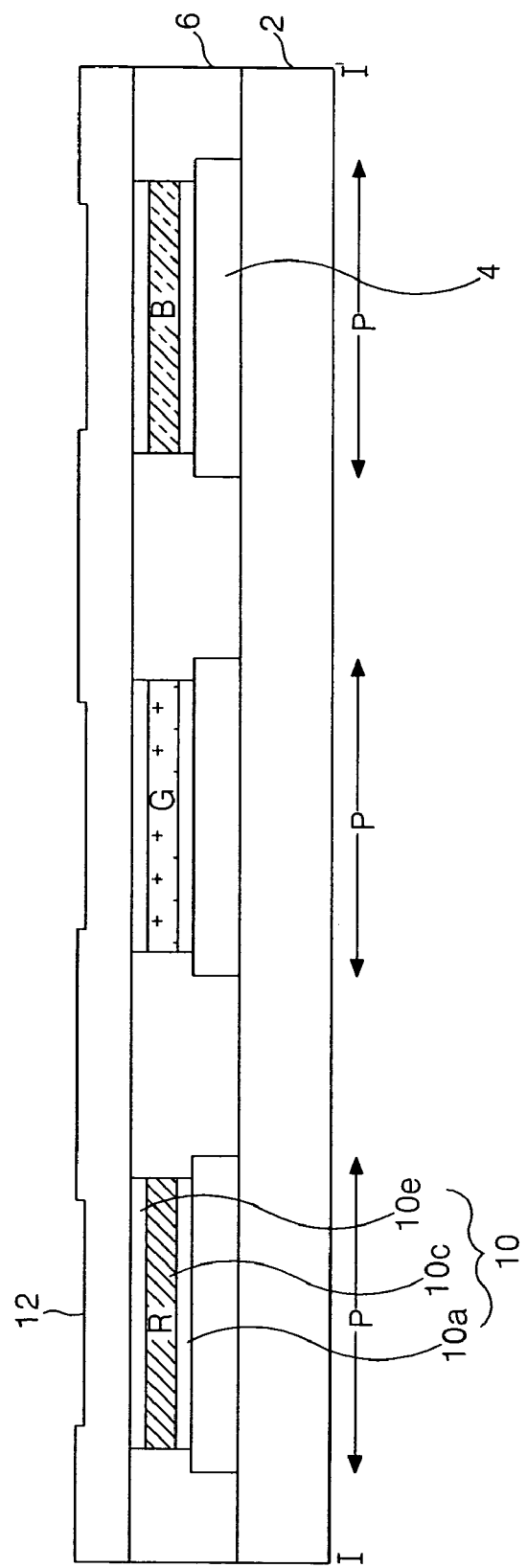
FIG. 2 illustrates a sectional diagram taken along the line "I-I'" of FIG. 1.
Figure 3A:
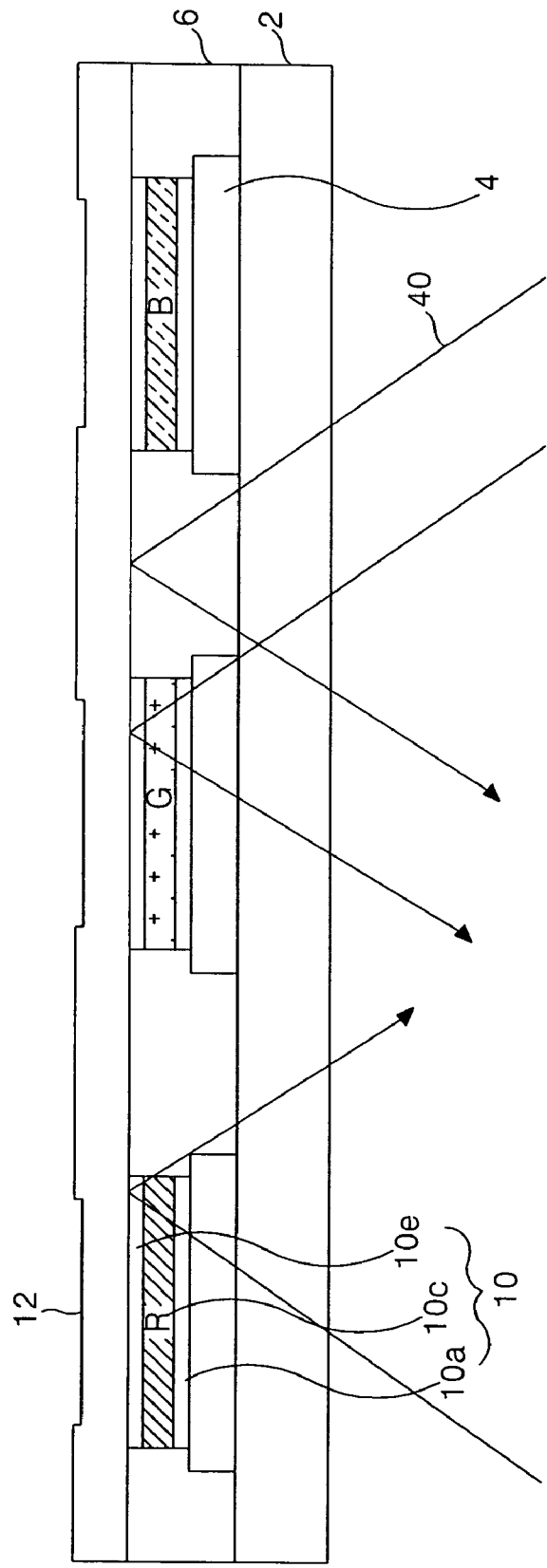
FIG. 3A is a diagram for explaining a reflection by an external light of the organic EL display device.
Figure 4:
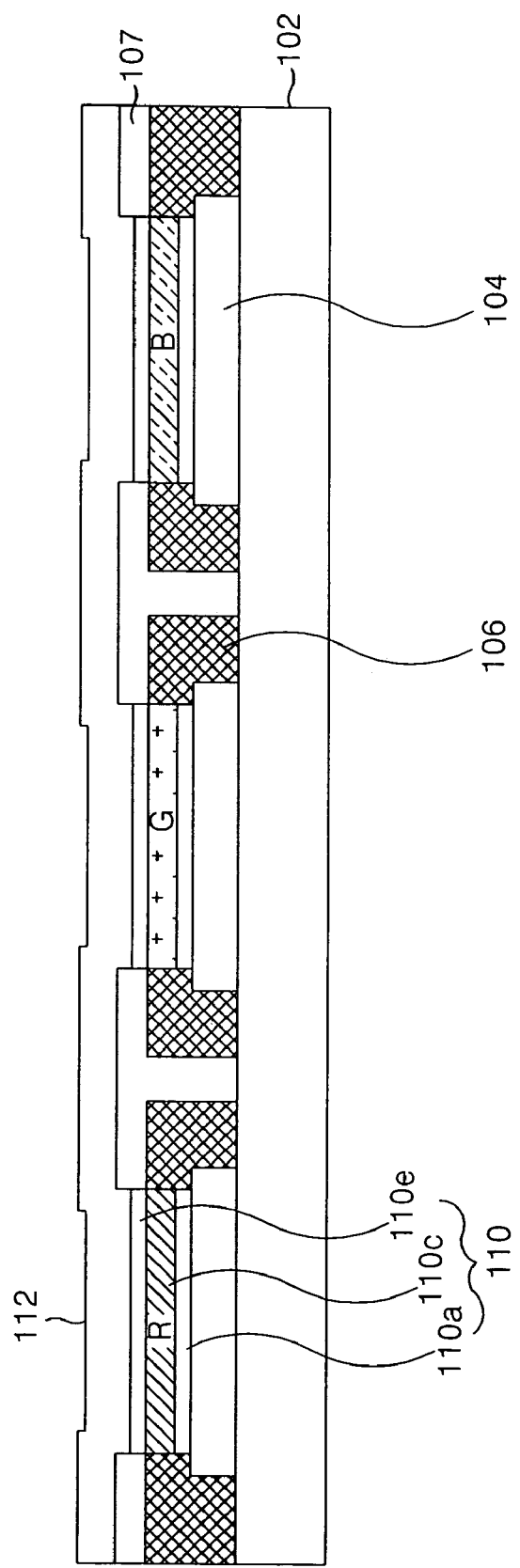
FIG. 4 is a diagram briefly representing an organic EL display device according to the present invention.

FIG. 4 is a sectional diagram representing an organic EL display device according to the present invention.

The organic EL display device shown in FIG. 4 includes an anode electrode 104 and a cathode electrode 112 which are formed on a substrate 102 to cross each other with an organic light emitting layer 110; a barrier rib (not shown) formed to cross the anode electrode and to be in parallel to the cathode electrode 112; a conductive light shielding film 106 which defines a light emitting area on the anode electrode 104 and intercepts an external light; and a insulating film 107 formed to cover the conductive light shielding film 106 and defining the light emitting area.

A plurality of anode electrodes 104 are formed on the substrate 102 in a stripe shape, and each of them is separated from one another with a designated distance therebetween.

The barrier rib (not shown) is formed in a direction of traversing the anode electrode 4, and has a reverse taper structure that an upper part has a wider width than a lower part. The organic light emitting layer 110 is formed by depositing a hole related layer 110A inclusive of a hole injection layer and a hole transport layer; a light emitting layer 110C to realize color; and an electron related layer 110E inclusive of an electron transport layer and an electron injection layer.

The conductive light shielding film 106 partially exposes the anode electrode 104 to define a light emitting area, and intercepts and absorbs the external light, thereby acting to improve the contrast ratio of the device.

Further, the light shielding film 106 is formed of a conductive material, thereby improving the conductivity of the anode electrode 104.

To describe this more particularly, it is as follows.

Figure 5:
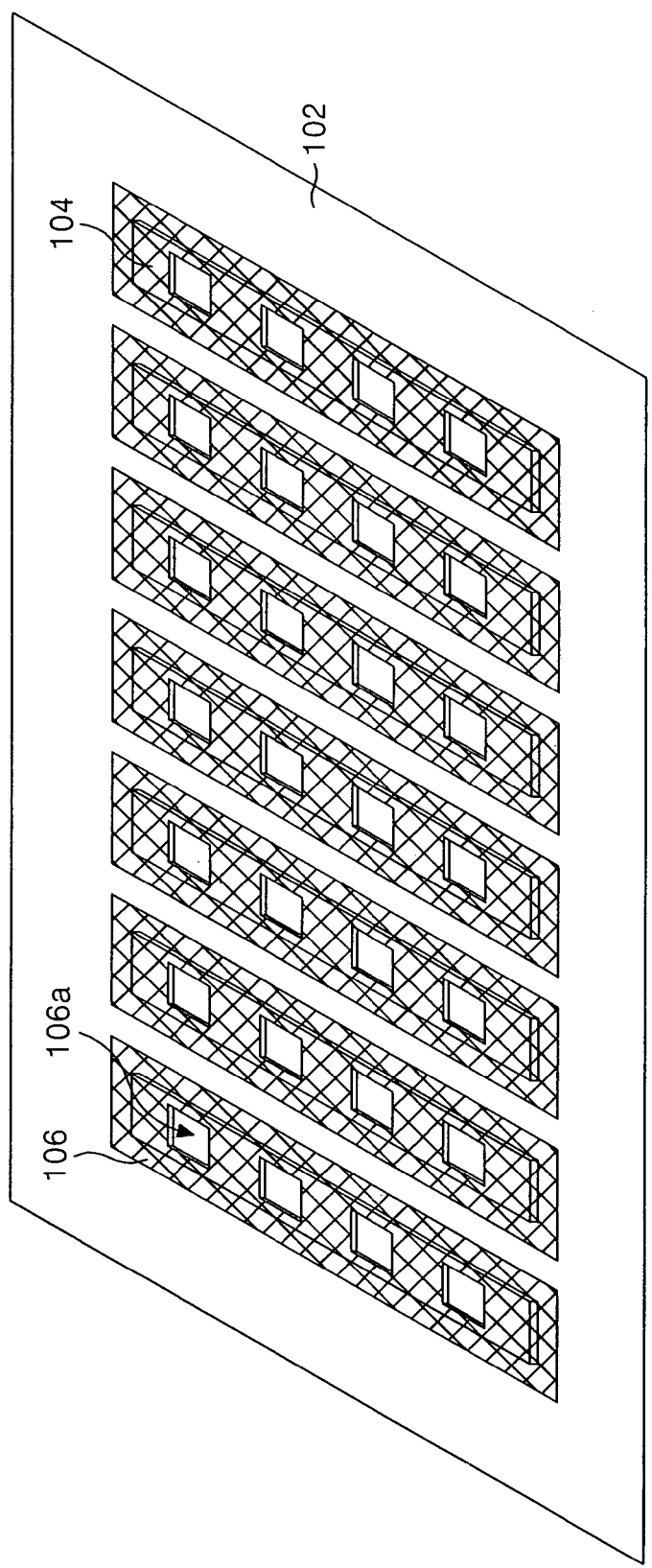
FIG. 5 is a diagram specifically representing a conductive light shielding film shown in FIG. 4.

The conductive light shielding film 106, as shown in FIG. 5, is formed with a wider width than the anode electrode to cover the anode electrode and has a hollow part 106A which exposes the anode electrode 104 partially. Further, the conductive light shielding film 106 is electrically separated from each other so that no conduction is made between the anode electrodes 104.

The conductive light shielding film 106 is formed of an opaque conductive material, thereby acting to intercept or absorb the external light which is incident by passing through the transparent substrate 102 and the anode electrode 104. Accordingly, the polarizer is not required in comparison with the related art, thus the transmittance increases when the device emits light, thereby increasing the brightness and enabling to reduce the power consumption.

Further, the conductive light shielding film 106 is formed of a conductive material and of a material which has a resistivity of about 20 [μΩ.cm]~200 [μΩ.cm], thus the conductive light shielding film 106 acts to improve the conductivity of the anode electrode 104 which is formed of a transparent electrode material. Accordingly, the voltage required in the anode electrode 104 is lowered to reduce the power consumption. Herein, the material of the conductive shielding film 106 is metal such as chromium Cr, molybdenum Mo, aluminum Al, nickel Ni, copper Cu, silver Ag, gold Au, indium In, tin Sn, zinc Zn and so on, or their compound.

In the organic EL display device, if a voltage is applied to the anode electrode 104 and the cathode electrode 112, the electrons generated at the cathode electrode 112 moves to the light emitting layer 10C through the electron related layer 110E. Further, the holes generated at the anode electrode 104 moves to the light emitting layer 110C through the hole related layer 110A. Accordingly, in the light emitting layer 110C, an exiton is formed by recombination of the electron and the hole which are supplied from the electron related layer 110E and the hole related layer 110A, and the exiton is excited again to a ground state to emit the light of a fixed energy to the outside through the anode electrode 104.

Hereinafter, in reference to FIGS. 6A to 6D, the fabricating method of the organic EL display device according to the present invention will be explained as follows.

Figure 6A:
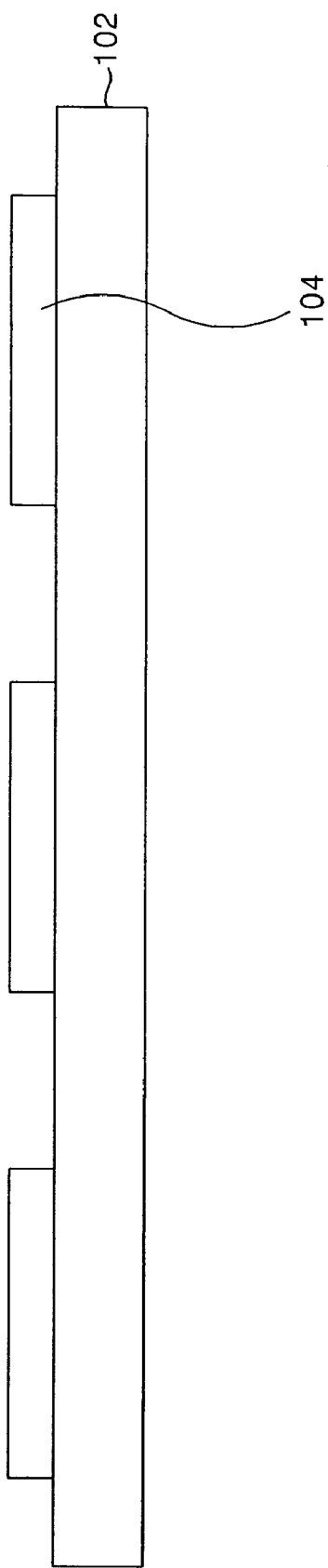
Figure 6B:
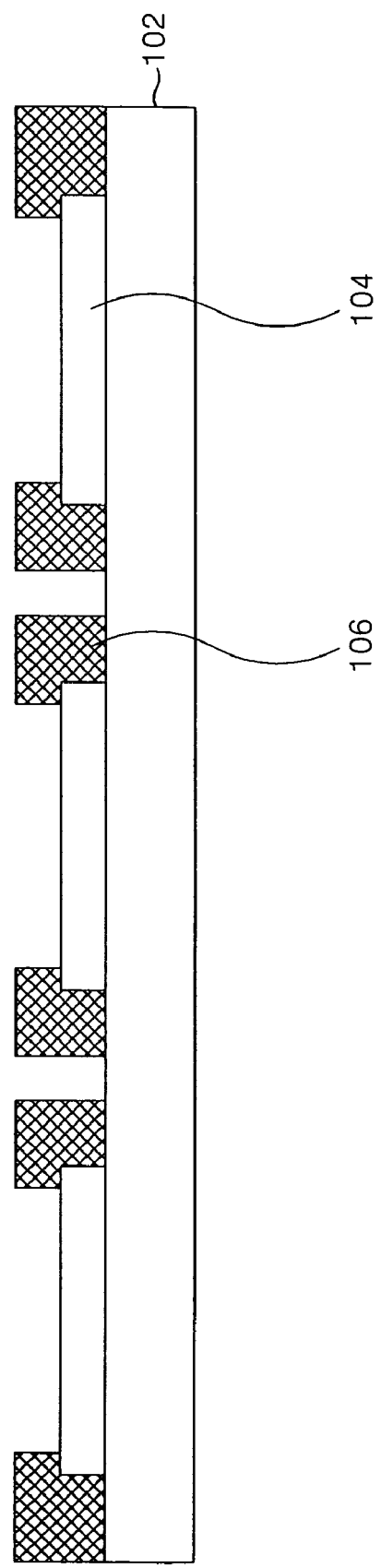

Firstly, after a transparent conductive metal material is deposited on the substrate 102 which is formed by use of a sodalime or a tempered glass, the transparent conductive metal material is patterned by a photolithography process and an etching process, thereby forming the anode electrode 104, as shown in FIG. 6A. Herein, the metal material is of indium tin oxide ITO or SnO2.

An opaque conductive metal material is deposited on the substrate where the anode electrode 104 is formed, the opaque conductive metal material is patterned by the photolithography process and the etching process, thus the conductive light shielding film 106, as shown in FIG. 6G, is formed with a wider width than the anode electrode 104 to cover the anode electrode 104 and has the hollow part 106A which partially exposes the anode electrode 104. Herein, the opaque conductive metal material is metal such as chromium Cr, molybdenum Mo, aluminum Al, nickel Ni, copper Cu, silver Ag, gold Au, indium In, tin Sn, zinc Zn and so on, or their compound. And, the conductive light shielding film formed to cover each of the anode electrodes 104 is electrically separated.

After a photosensitive organic material is deposited on the substrate 104 where the conductive light shielding film 106, the photosensitive organic material is patterned by the photolithography process and so on, thereby forming an insulating film 107. And then, after a photosensitive organic material is deposited, the photosensitive organic material is patterned by the photolithography process, thereby forming a barrier rib (not shown).

An organic light emitting layer 110, as shown in FIG. 6C, is formed on the substrate 102 where the barrier rib is formed, by a deposition method such as thermal deposition, vacuum deposition and so on using a common mask and a metal (or shadow) mask.

Figure 6D:
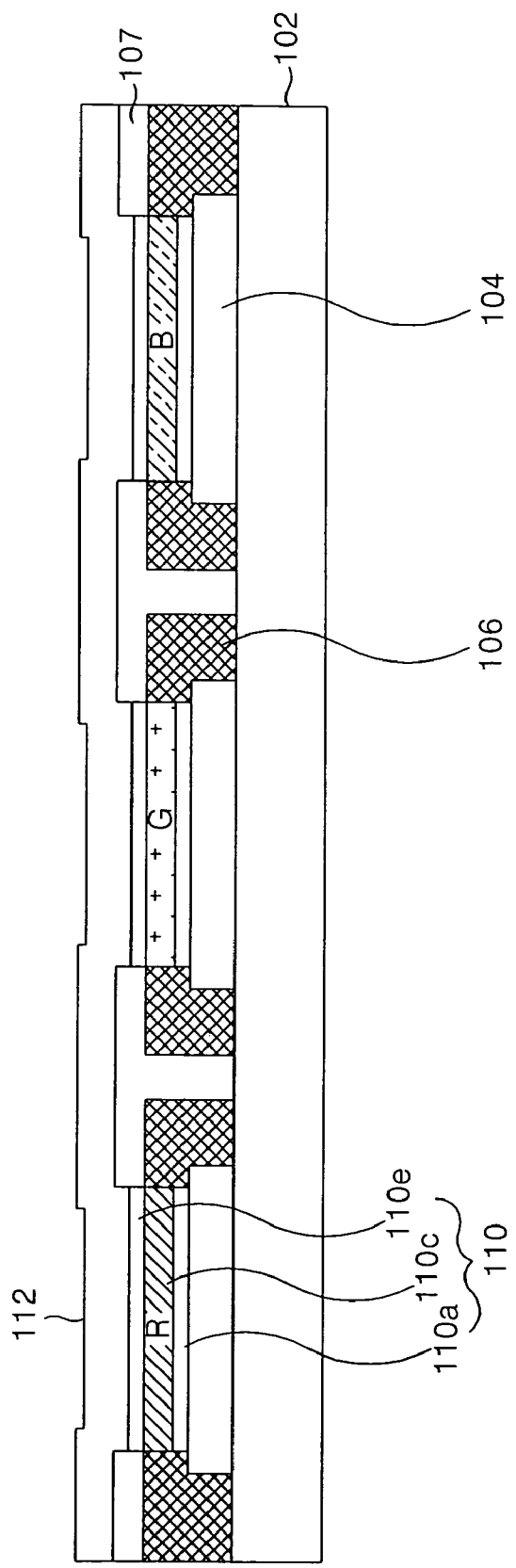

A metal material is deposited on the substrate 102 where the organic light emitting layer 110 is formed, thereby forming the cathode electrode 112, as shown in FIG. 6D.

In this way, the organic EL display device and the fabricating method thereof according to the present invention has the related art reflection protective film removed and the conductive light shielding film 106 formed. Accordingly, the light transmittance is improved when the device emits light, thereby increasing the brightness.

Further, the conductive light shielding film 106 is formed of a material with conductivity to improve the conductivity of the anode electrode 104. Accordingly, the voltage applied to the anode electrode 104 is lowered, thereby enabling to reduce the power consumption.

As described above, the organic EL display device and the fabricating method thereof according to the present invention has the related art reflection protective film removed and forms the conductive light shielding film, thereby improving the brightness and reducing the power consumption.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device, comprising:
    a substrate;
    a plurality of anode electrodes formed on the substrate;
    a plurality of conductive light shielding films, each conductive light shielding film being formed on both sides and a portion of upper surface of the anode electrode in a separate pattern so that the anode electrodes are insulated from one another, wherein the conductive light shielding film is formed to directly cover both sides and a portion of upper surface of the anode electrode, and the conductive light shielding film has a first hollow part that partially exposes the anode electrode;
    an insulating layer formed on an upper surface of the conductive light shielding film and a portion of the substrate exposed between the conductive light shielding films, wherein the insulating layer has a second hollow part that exposes a portion of the anode electrode exposed by the first hollow part; and
    an organic light emitting layer formed on the anode electrode exposed by the first and second hollow parts,
    wherein a width of the first hollow part is same as a width of the second hollow part, and the organic emitting layer is formed within the first and the second hollow parts formed by the conductive light shielding films and the insulating layer.

2. The organic electro luminescence display device according to claim 1, wherein the conductive light shielding film partially exposes the anode electrode to define a light emitting area.

3. The organic electro luminescence display device according to claim 1, further comprising:
    a barrier rib formed to cross the anode electrode; and
    a cathode electrode formed to cross the anode electrode with the organic light emitting layer therebetween.

4. The organic electro luminescence display device according to claim 1, wherein the conductive light shielding film includes an opaque material.

5. The organic electro luminescence display device according to claim 4, wherein the opaque material is one or more metals selected from the group consisting of Cr, Mo, Al, Ni, Cu, Ag, Au, In, Sn, and Zn.

6. The organic electro luminescence display device according to claim 1, wherein the resistivity of the conductive light shielding film is about 20~200 $\mu\Omega\cdot cm$.

7. The organic electro luminescence display device according to claim 1, wherein the hollow part is square.

8. A fabricating method of an organic electro luminescence display device, comprising the steps of:
    forming a plurality of anode electrodes on a substrate;
    forming a plurality of conductive light shielding films, each conductive light shielding film being formed on both sides and a portion of upper surface of the anode electrode in a separate pattern so that the anode electrodes are insulated from one another, wherein the conductive light shielding film is formed to directly cover both sides and a portion of upper surface of the anode electrode, and the conductive light shielding film has a hollow part that partially exposes the anode electrode;
    forming an insulating layer on an upper surface of the conductive light shielding film and a portion of the substrate exposed between the conductive light shielding films, wherein the insulating layer has a second hollow part that exposes a portion of the anode electrode exposed by the first hollow part; and
    forming an organic light emitting layer on the anode electrode exposed by the first and second hollow parts,
    wherein a width of the first hollow part is same as a width of the second hollow part, and the organic emitting layer is formed within the first and the second hollow parts layer is formed within the first and the second hollow parts without a gap between the organic light emitting layer and the conductive light shielding films and the insulating layer.

9. The fabricating method according to claim 8, wherein the conductive light shielding film partially exposes the anode electrode to define a light emitting area.

10. The fabricating method according to claim 8, further comprising:
    forming a barrier rib to cross the anode electrode; and
    forming a cathode electrode to cross the anode electrode with the organic light emitting layer therebetween.

11. The fabricating method according to claim 8, wherein the conductive light shielding film includes an opaque material.

12. The fabricating method according to claim 11, wherein the opaque material is one or more metals selected from the group consisting of Cr, Mo, Al, Ni, Cu, Ag, Au, In, Sn, and Zn.

13. The fabricating method according to claim 8, wherein each of the first and second hollow part is square.

* * * * *